United States Patent
Cline

(10) Patent No.: US 6,522,786 B1
(45) Date of Patent: Feb. 18, 2003

(54) GRADIENT FILTER AND METHOD FOR THREE DIMENSIONAL NMR DATA SET

(75) Inventor: Harvey Ellis Cline, Schenectady, NY (US)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 09/332,393

(22) Filed: Jun. 14, 1999

(51) Int. Cl.[7] .................. G06T 5/30; G06T 15/00; G06K 9/40; A61B 5/055
(52) U.S. Cl. .................. 382/257; 382/275; 382/308; 382/128; 382/154; 600/410
(58) Field of Search .................. 382/257, 260, 382/275, 128, 154, 308; 600/410; 324/307; 345/419, 424

(56) References Cited

U.S. PATENT DOCUMENTS

| | | | |
|---|---|---|---|
| 4,984,157 A | 1/1991 | Cline et al. .................. 345/424 |
| 5,226,113 A | 7/1993 | Cline et al. .................. 345/424 |
| 5,512,827 A | 4/1996 | Hardy et al. .................. 600/410 |
| 5,514,962 A | 5/1996 | Cline et al. .................. 324/309 |
| 6,058,218 A | * 5/2000 | Cline .................. 382/257 |
| 6,155,978 A | * 12/2000 | Cline et al. .................. 128/916 |
| 6,211,674 B1 | * 4/2001 | Cline et al. .................. 324/307 |

* cited by examiner

Primary Examiner—Scott Rogers
(74) Attorney, Agent, or Firm—Jean K. Testa; Patrick K. Patnode

(57) ABSTRACT

A method and apparatus for reducing noise in a three dimensional rectilinear parallelepiped data point array includes both erosion and dilation processes for each array point value. The erosion process includes the steps of determining gradients along all three axis which pass through a data point and modifying the point value as a function of the gradients to generate an updated point value. The dilation process includes the steps of using point values from the updated array, determining gradients along all three axis which pass through the point, and modifying the updated point value as a function of the gradients to generate a final and revised point value.

38 Claims, 4 Drawing Sheets

GRADIENT FILTER AND METHOD FOR THREE DIMENSIONAL NMR DATA SET

BACKGROUND OF THE INVENTION

The field of this invention is nuclear magnetic resonance imaging methods and systems. More particularly, the invention relates to a method and apparatus for reducing noise in a three dimensional data array generated using magnetic resonance imaging techniques.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

While many different tissue samples and various bodies may be examined using NMR imaging, in order to further simplify this explanation the invention is described in the context of an exemplary transaxial volume through a patient's body wherein the volume includes the patient's heart and the volume will be referred to as a region of interest. In addition, it will be assumed that an NMR imaging system includes a three dimensional imaging area having Cartesian coordinate x, y and z axes and that the patient is positioned within the imaging area with the patient's height (i.e. from head to feet) defining an axis along the z axis.

When the region of interest is subjected to a uniform magnetic field (polarizing field $B_0$), the individual magnetic moments of the nuclear spins in the region attempt to align with the polarizing field, but precess about the direction of the field in random order at their characteristic angular or Larmor frequencies, producing a net magnetic moment $M_z$ in the direction of the polarizing field.

If the region of interest is subjected to a magnetic field (excitation field $B_1$) which is in the x-y plane and which is near the Larmor frequency, the net aligned moment $M_z$ may be "tipped" into the x-y plane to produce a net transverse magnetic moment which is rotating or spinning in the xy plane at the Larmor frequency.

The NMR signal which is emitted by the excited spins after the excitation signal $B_1$ is terminated is a function of physical properties of the spin which generates the signal. These emitted NMR signals are digitized and processed to generate an NMR data set.

To determine the point of origin of an NMR signal, each NMR signal is encoded with spatial information, such as by the "spin-warp" technique, discussed by W. A. Edelstein et al. in "Spin Warp NMR Imaging and Applications to Human Whole-Body Imaging", *Physics in Medicine and Biology*, Vol. 25, pp. 751–756 (1980) which is incorporated herein by reference.

According to the spin-warp scheme, spatial encoding is accomplished by employing three magnetic gradient fields ($G_x$, $G_y$, and $G_z$) which have the same direction as polarizing field $B_0$ and which have gradients along the x, y and z axes, respectively. By controlling the strength of these gradients during each NMR cycle, the spatial distribution of spin excitation can be controlled and the point of origin of the resulting NMR signals can be identified.

A useful acquisition technique is the slice or two dimensional technique wherein NMR data are acquired for a single transaxial slice of a region of interest at one time. The invention is described in the context of slice imaging wherein several slices are acquired consecutively and are "stacked" to form a three dimensional data set.

To determine the z-axis origin of a signal during slice data acquisition, signal generation is limited to a specific transaxial slice of the region of interest using gradient field $G_z$. To this end, the Larmor frequency F of a spin can be expressed as:

$$F=(B_0+B_z)\gamma \tag{1}$$

where $B_z$ is essentially the strength of gradient $G_z$ within a specific transaxial slice of the region of interest and is the magnetogyric constant of the nucleus of the material in which the field is generated. Because the gradient field strength varies along the z-axis, each z-axis slice has a different Larmor frequency F. When the excitation signal $B_0$ is provided at a specific excitation frequency, only spins within the "selected" z-axis slice which are at the excitation frequency are tipped. Therefore, when the excitation signal $B_0$ is turned off, only spins within the selected z-axis slice generate NMR signals.

To spatially encode NMR signals along the x axis, excitation signal $B_0$ is provided at a small range of frequencies. The x axis gradient $G_x$ is small enough that all of the spins along the x axis have Larmor frequencies within the small range of excitation signal frequencies and therefore each of the spins along the x axis generates an NMR signal when the excitation signal is turned off, each x-axis signal having a unique and identifiable frequency. Hence, x-axis position can be determined by identifying the frequency of each NMR signal received during an acquisition. This type of encoding is commonly referred to as frequency encoding.

To encode y axis position within NMR signals, the y axis gradient $G_y$ is employed to cause spins along the y axis to have different phases; therefore, resulting NMR signals from spins along the y axis have different phases which can be used to determine y axis position. Because y axis position is encoded using signal phase, this type of encoding is commonly referred to as phase encoding.

After data have been acquired for one region of interest slice, the acquisition process is repeated for adjacent region of interest slices until data have been acquired for every slice within the region of interest. After digitizing and processing, the slice data are combined to provide a three dimensional data point (TDDP) array. The TDDP array includes a plurality of data points distributed at regular parallelepiped positions in a three dimensional lattice within the region of interest, at least one value (Vxyz) being characteristic of a physical property of the region of interest associated with each respective one of the lattice positions. Each cubically adjacent set of eight such positions defines a cubic volume referred to hereinafter as a "voxel", a physical property value being specified for each of the eight voxel vertices.

After a complete TDDP array has been acquired and stored, the array can be used to form an image of the region of interest using one of many well known reconstruction techniques.

For the purposes of this explanation, signals which are generated by spins and are characteristic of the property of the region of interest being detected will be referred to as "true" signals, signal components which are randomly generated within a region of interest will be referred to generally as "noise" and the combination of true signals and noise will be referred to as a "combined" signal.

While extreme measures are taken when designing an NMR system to minimize stray and random magnetic fields and signals within the region of interest during a data acquisition period, noise often occurs in two forms: first, as a background distortion exhibiting a low and relatively constant amplitude throughout a region of interest, and second, with appreciable amplitude caused by localized magnetic fields within the region of interest. The latter type of noise, being localized, will be referred to hereinafter as "localized noise".

Unfortunately, extremely sensitive sensing coils required to detect low amplitude true signals also detect an appreciable amount of background noise from within the region of interest during an acquisition period. Therefore, after a data acquisition period, each TDDP array data point typically includes both a true signal component and a noise component (i.e each data point value constitutes a combined signal). In addition, some data points are dominated by a localized noise component.

While an image can be generated using combined signals, the noise components reduce image clarity and minimize diagnostic usefulness of the image. In addition, localized noise causes artifacts within a resulting image. For this reason, to the extent possible, noise must be eliminated from the TDDP array prior to generating an image therefrom.

Various filtering techniques have been devised for reducing image noise. These filtering techniques can generally be divided into two different types, thresholding and morphological filtering. According to an exemplary thresholding technique, each combined signal within the TDDP array is compared to a threshold value. The threshold value is selected such that, below the threshold value most signals are generally known to be dominated by a background noise component (i.e. the true signal component is relatively small). Where a combined signal value is less than the threshold value, the combined signal value is set equal to zero. Where a combined signal value is equal to or greater than the threshold value, the combined signal value is maintained in the TDDP array.

While thresholding eliminates isolated low amplitude noise (i.e. where the true signal component is relatively small compared to the noise component), such techniques fail to reduce noise within a combined signal where a true signal component is appreciable. In addition, thresholding techniques fail to eliminate localized noise where noise amplitude is relatively high.

Morphological filters may be categorized as either binary or gray level. Binary filters use an eroding and dilating protocol to reduce image noise. To this end, an exemplary binary filter first uses the thresholding technique to reduce background noise and generate a binary TDDP array. In the present context, binary indicates that any data point value above the threshold is set equal to a normalized one value while any data point value below the threshold value is set equal to zero. Next, with the binary array formed, an erosion process is performed on the array wherein structures within the array are identified, a structure being any one separate data point, or a set of two or more adjacent data points, each having a value of one. An exemplary structure may include a sphere which has a diameter of 100 points, each point within the sphere having a one value. To erode the array, data points which have one values and are associated with the outer boundaries of each structure are changed to zero values. In effect the "outer layer" of each structure within the array is "peeled" away. For example, after a signal erosion process, the spherical structure which initially had a diameter of 100 data points would have a diameter of 98 data points (i.e. the outer layer on both sides of the sphere is eliminated). In most embodiments several erosion steps are consecutively performed, thereby reducing the size of each structure within the array.

While most structures within the array are maintained throughout the erosion process, some structures are entirely eliminated. For example, small structures, such as a single data point having a one value, are eliminated during a first erosion process. During a second erosion process, a sphere initially having a four data point diameter would be eliminated, and so on. Such elimination is intended, as most such small structures are attributable to localized noise.

After the erosion process, the dilation process is performed on the eroded array. Dilation is the opposite of erosion and adds layers to each structure within an array instead of removing layers. For example, during dilation, where the spherical structure mentioned above includes a diameter of 96 data points after erosion, the sphere would have a diameter of 98 after a first dilation process, and the diameter would be 100 after a second dilation process, and so on.

After dilation the resulting binary array can be used to generate an image or, in the alternative, can be used as a mask to select sections of data from the initial TDDP array for generating an image.

In addition to eliminating background noise, the binary filter also eliminates free standing localized noise from the TDDP array and therefore is generally a better filtering option than simple thresholding. Unfortunately, like thresholding, binary filtering cannot eliminate noise components which are combined with true signals to form combined signals.

Gray level morphological filters reduce data point intensities to minimize noise. Thus, for each data point in a TDDP array, a gray level filter compares the intensity of the data point and all surrounding data points in the TDDP array (e.g. above, below, left, right, front and behind) and replaces the data point intensity with the minimum intensity level of adjacent points. The resulting data point array includes minimal background noise and minimal localized noise throughout the entire array.

While gray level filters are advantageous, they can cause reduction in anatomical edge annunciation as resulting images have "smeared" gray levels (i.e. the gray scale contrast is reduced).

The above described filtering techniques have been combined in advantageous ways to reap benefits of each of the separate techniques. While filtered images have proven good enough for most diagnostic purposes there is always a desire to have better imaging techniques wherein the effects of noise are further eliminated without reducing the effects of true signals.

SUMMARY OF THE INVENTION

An exemplary embodiment of the invention includes a method for reducing noise in a three dimensional rectilinear parallelepiped data point array, the three dimensions being first, second and third dimensions and each data point associated with a point value. The method constitutes an erosion process for each array data point, wherein the data point is a point of interest, and comprises determining first, second and third erosion gradients through the point of interest along the first, second and third dimensions, respectively, and modifying the point of interest value as a function of the erosion gradients, thereby generating an updated point of interest value.

The method also constitutes a dilation process comprising, for each updated point of interest value, determining first, second and third dilation gradients through the updated point of interest along the first, second and third dimensions, respectively, and modifying the updated point of interest value as a function of the dilation gradients, thereby generating a revised point of interest value.

By using gradients to erode and then dilate TDDP array data point values, both background and localized noise can essentially be eliminated from a data set without appreciably deteriorating edges. In any event, images resulting from use of the inventive filter have better and more accurate characteristics than images generated using other filters.

DESCRIPTION OF THE PREFERRED EMBODIMENT

A. Hardware

Figure 1:
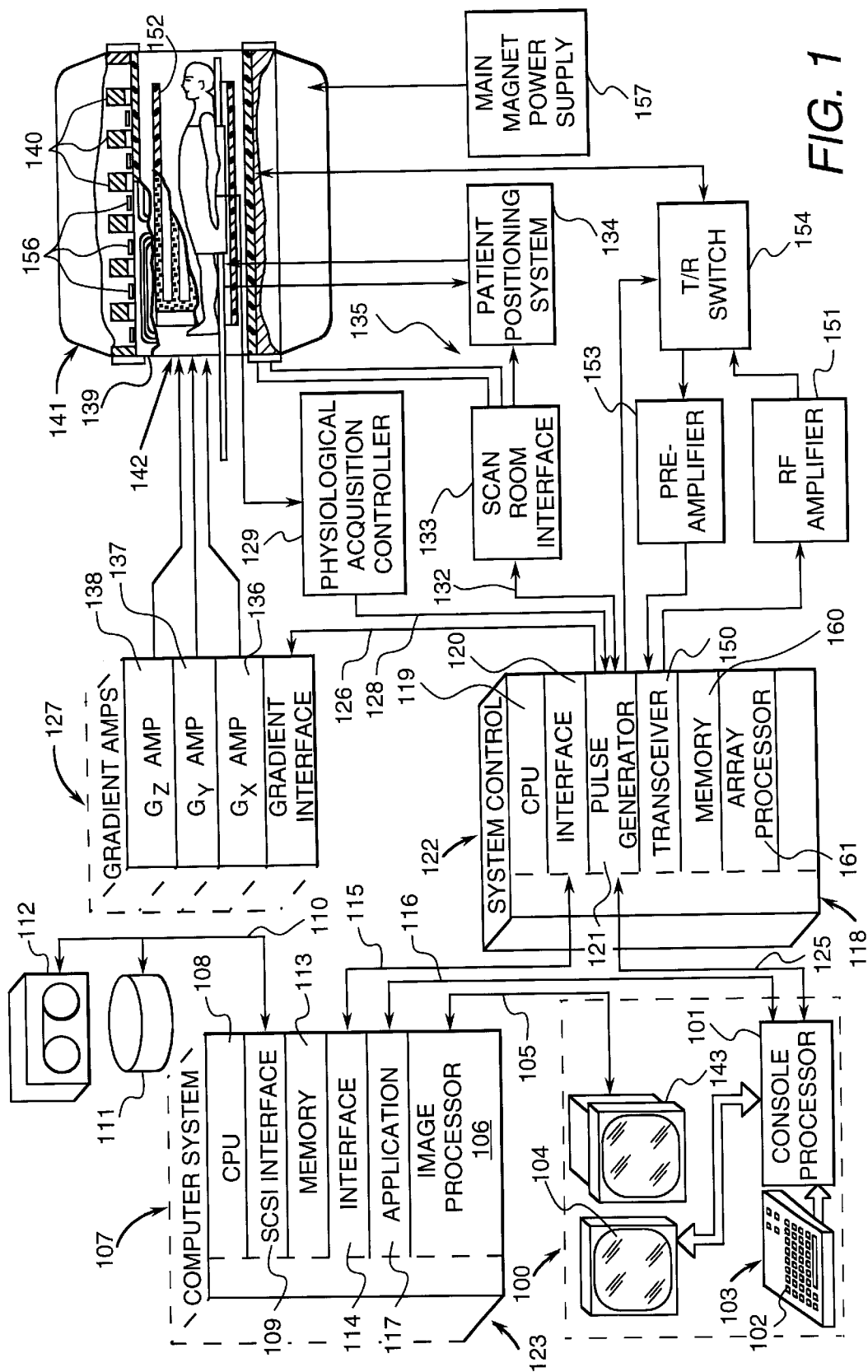
FIG. 1 is a block diagram of an NMR system employing the present invention.

FIG. 1 illustrates the major components of an NMR system which incorporates the invention and is sold by General Electric Company under the trademark "SIGNA". Operation of the system is controlled from an operator console 100 which includes a console processor 101 that scans a keyboard 102 and receives inputs from a human operator through a control panel 103 and a plasma display/ touch screen 104. Console processor 101 communicates through a communications link 116 with an applications interface module 117 in a separate computer system 107. Through keyboard 102 and controls 103, an operator controls production and display of images by an image processor 106 in computer system 107, which is coupled to a video display 143 on console 100 through a video cable 105.

Computer system 107 includes modules which communicate with each other through a backplane 123. In addition to application interface 117 and image processor 106, these include a CPU 108 that controls the backplane, and an SCSI interface 109 that couples computer system 107 through a bus 110 to a set of peripheral devices, including disk storage 111 and tape drive 112. Computer system 107 also includes a memory 113, known in the art as a frame buffer, for storing image data arrays, and a serial interface 114 that links computer system 107 through a high speed serial link 115 to a system interface module 120 located in a system control cabinet 122.

System control 122 includes a series of modules coupled together by a common backplane 118. Backplane 118 is comprised of bus structures, including a bus structure controlled by a CPU module 119. Serial interface module 120 connects backplane 118 to high speed serial link 115, and pulse generator module 121 connects backplane 118 to operator console 100 through a serial link 125. It is through serial link 125 that system control 122 receives commands from the operator designating which scan sequence is to be performed.

Pulse generator module 121 operates the system components to carry out the desired scan sequence, producing data designating the timing, strength and shape of the RF pulses to be produced, and the timing of and length of a data acquisition window. Pulse generator module 121 also connects through a serial link 126 to a set of gradient amplifiers 127, and conveys data thereto which indicate timing and shape of the gradient pulses to be produced during the scan. Pulse generator module 121 also receives patient data through a serial link 128 from a physiological acquisition controller 129. A physiological acquisition controller 129 can receive a signal from various sensors attached to the patient. For example, controller 129 may receive ECG (electrocardiogram) signals from electrodes or respiratory signals from a bellows and produce pulses for pulse generator module 121 that synchronizes the scan with the patient's cardiac cycle or respiratory cycle. Pulse generator module 121 also connects through a serial link to a scan room interface circuit 133 which receives signals at inputs 135 from various sensors associated with the position and condition of the patient and the magnet system. Additionally, a patient positioning system 134 receives commands through scan room interface circuit 133 for moving the patient cradle and transporting the patient to the desired position for the scan.

The gradient waveforms produced by pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. Gradient coil assembly 139 forms part of a magnet assembly 141 which includes a polarizing magnet 140 that produces either a 0.5 or a 1.5 Tesla polarizing field extending horizontally through a bore 142. Gradient coils 139 encircle bore 142 and, when energized, generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x=\partial B_z/\partial x$, $G_y=\partial B_z/\partial y$ and $G_z=\partial B_z/\partial z$, and the magnetic field at any point (x,y,z) in the bore of magnet assembly 141 is given by $B(x,y,z)=B_0+G_x x+G_y y+G_z z$. The gradient magnetic fields encode spatial information into the NMR signals emanating from the patient being scanned.

Located within bore 142 is a circular cylindrical whole-body RF coil 152 that produces a circularly polarized RF field in response to RF pulses provided by a transceiver module 150 in system control cabinet 122. These pulses are amplified by an RF power amplifier 151 and coupled to RF coil 152 by a transmit/receive switch 154. Waveforms and control signals are provided by pulse generator module 121 and utilized by transceiver module 150 for RF carrier modulation and mode control. The resulting NMR signals radiated by the excited nuclei in the patient may be sensed by the same RF coil 152 and coupled through transmit/ receive switch 154 to a preamplifier 153. The amplified NMR signals are demodulated, filtered, and digitized in the receiver section of transceiver 150. Transmit/receive switch 154 is controlled by a signal from pulse generator module 121 to couple RF amplifier 151 to coil 152 during the transmit mode and to couple coil 152 to preamplifier 153 during the receive mode. Transmit/receive switch 154 also enables a separate RF coil (for example, a head coil or surface coil) to be used in either the transmit or receive mode.

In addition to supporting polarizing magnet 140, gradient coils 139 and RF coil 152, main magnet assembly 141 also supports a set of shim coils 156 associated with main magnet 140 to correct inhomogeneities in the polarizing magnet field. A main power supply 157 is utilized to bring the polarizing field produced by main magnet 140 to the proper operating strength and is then removed.

The NMR signals picked up by RF coil 152 are digitized by transceiver module 150 and transferred to a memory module 160 of system control 122. When the scan is completed and an entire array of data has been acquired in memory modules 160, an array processor 161 operates to Fourier transform the data into an array of image data. The image data are conveyed through serial link 115 to computer system 107 for storage in disk memory 111. In response to commands received from operator console 100, the image data may be archived on tape drive 112, or may be further processed by image processor 106 and conveyed to operator console 100 for presentation on video display 143.

Figure 2:
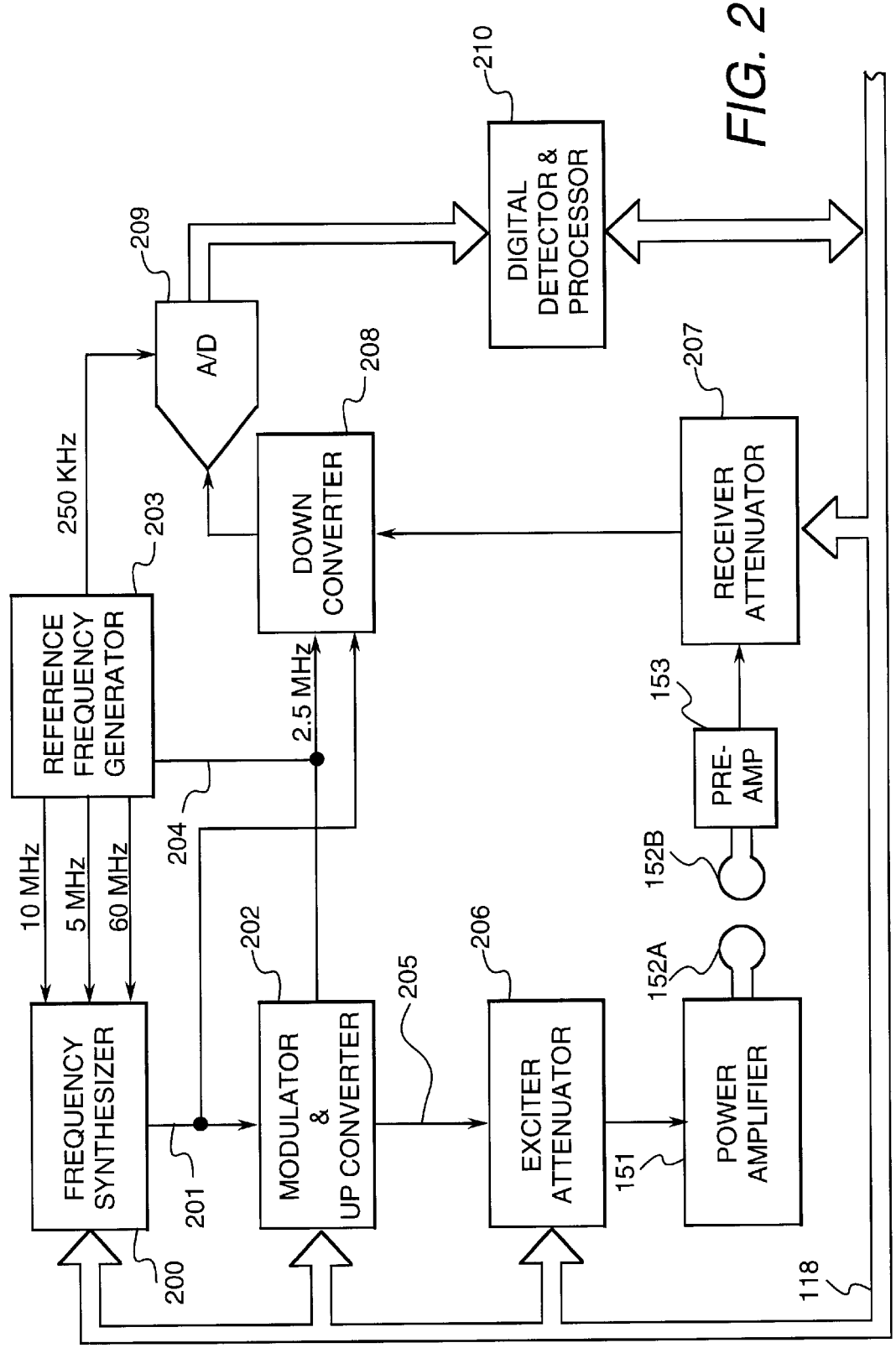
FIG. 2 is a block diagram of the transceiver which forms part of the NMR system of FIG. 1.

Referring to FIGS. 1 and 2, transceiver 150 includes components that produce RF excitation field $B_1$ through RF power amplifier 151 at a coil 152A and components which receive the resulting NMR signal induced in a coil 152B. Coils 152A and 152B may be separate, as shown in FIG. 2, or they may be a single, wholebody coil, as shown in FIG. 1. The base, or carrier, frequency of the RF excitation field is produced under control of a frequency synthesizer 200 (FIG. 2) which receives a set of digital signals (CF) through backplane 118 from CPU module 119 and pulse generator module 121. These digital signals indicate the frequency and phase of the RF carrier signal which is produced at an output 201 (FIG. 2). The commanded RF carrier is applied to a modulator and up converter 202 (FIG. 2) where it is amplitude modulated in response to a signal R(t) also received through backplane 118 from pulse generator module 121. Signal R(t) defines the envelope, and therefore the bandwidth, of the RF excitation pulse to be produced in module 121 by sequentially reading out a series of stored digital values that represent the desired envelope. These stored digital values may be changed from operator console 100 to enable any desired RF pulse envelope to be produced. Modulator and up converter 202 produces an RF pulse at the desired Larmor frequency at an output 205.

The magnitude of the RF excitation pulse from output 205 of modulator and up converter 202 is attenuated by an exciter attenuator circuit 206 (FIG. 2) which receives a digital command from backplane 118. The attenuated RF excitation pulses are applied to power amplifier 151 that drives RF coil 152A. For a more detailed description of this portion of the transceiver 122, reference is made to commonly assigned Stormont et al. U.S. Pat. No. 4,952,877, RF Synthesizer or an NMR Instrument, issued Aug. 28, 1990, which is incorporated herein by reference.

The NMR signal produced by the patient is picked up by receiver coil 152B (FIG. 2) and applied through preamplifier 153 to the input of a receiver attenuator 207 (FIG. 2). Receiver attenuator 207 further amplifies the NMR signal which is attenuated by an amount determined by a digital attenuation signal from backplane 118. Receiver attenuator 207 is turned on and off by a signal from pulse generator module 121 so as not to be overloaded during RF excitation.

The received NMR signal is at or around the Larmor frequency, which, in a preferred embodiment, is about 63.86 MHz for 1.5 Tesla and 21.28 MHz for 0.5 Tesla. This high frequency signal is down converted in a two step process by a down converter 208 (FIG. 2) which first mixes the NMR signal from receiver attenuator 207 with the carrier signal from synthesizer 200 and then mixes the resulting difference signal with the 2.5 MHz reference signal on input 204. The resulting down converted NMR signal has a maximum bandwidth of 125 kHz and is centered at a frequency of 187.5 kHz. The down converted NMR signal is applied to the input of an analog-to-digital (A/D) converter 209 which samples and digitizes the analog signal at a rate of 250 kHz. The output signal of A/D converter 209 is applied to a digital detector and signal processor 210 which produces 16-bit in-phase (I) values and 16-bit quadrature (Q) values corresponding to the received digital signal. The resulting stream of digitized I and Q values of the received NMR signal is supplied through backplane 118 to memory module 160 where these values are employed to reconstruct an image.

To preserve the phase information contained in the received NMR signal, both modulator and up converter 202 in the exciter section and down converter 208 in the receiver section are operated with common signals. More particularly, the carrier signal at the output of frequency synthesizer 200 and the 2.5 MHz reference signal at the output of reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by reference frequency generator 203 from a common 20 MHz master clock signal. The latter three reference signals are employed by frequency synthesizer 200 to produce the carrier signal. For a more detailed description of the receiver, reference is made to commonly assigned Stormont et al. U.S. Pat. No. 4,992,736, "Radio Frequency Receiver for a NMR Instrument", issued Feb. 12, 1991, which is incorporated herein by reference.

It will be assumed that a full set of NMR imaging data of a region of interest has been acquired and processed to generate a three dimensional data point (TDDP) array indicating at least one property of the region of interest. The data point array is stored in memory 113. For example, the physical properties of the TDDP array may be spin-spin or lattice-spin relaxation times, as well known in the art.

A TDDP array includes adjacent cubic voxel elements, each element having eight vertices. Associated with each vertex is one data value which represents the physical property at the corresponding spatial position within the region of interest. The spatial positions are located in regular patterns defining regularly spaced grid locations within the region of interest. The grid locations in turn define a plurality of adjacent voxels within the region. For purposes of this explanation it will be assumed that the grid positions are aligned with the x, y and z axes of bore 142 where the z axis is along the bore length, the x axis is horizontal and the y axis is vertical.

Each array data point is surrounded by six other data points. For example, referring to FIG. 3, a data point P separates east and west points E and W, respectively, along an X axis (i.e. an east-west axis), separates north and south points N and S, respectively, along a Y axis (i.e. a north-south axis) and separates forward and rearward points, F and R, respectively, along a z axis (i.e. a fore-rear axis). For purposes of this explanation point P will be referred to as a point of interest, north and south points N, S will be referred to as a first point pair, east and west points E, W will be referred to as a second point pair, forward and rearward points F, R will be referred to as a third point pair, each of the north, east and forward points N, E and F, respectively, will be referred to as the first point value p1 in an associated pair and each of the values of the south, west and rearward points S, W and R, respectively, will be referred to as the second point value p2 in an associated pair. In addition, a first point set will include the first point pair (N, S) and the point of interest P, a second point set will include the second point pair (E, W) and the point of interest P, and a third point set will include the third point pair (F, R) and the point of interest P.

Figure 4:
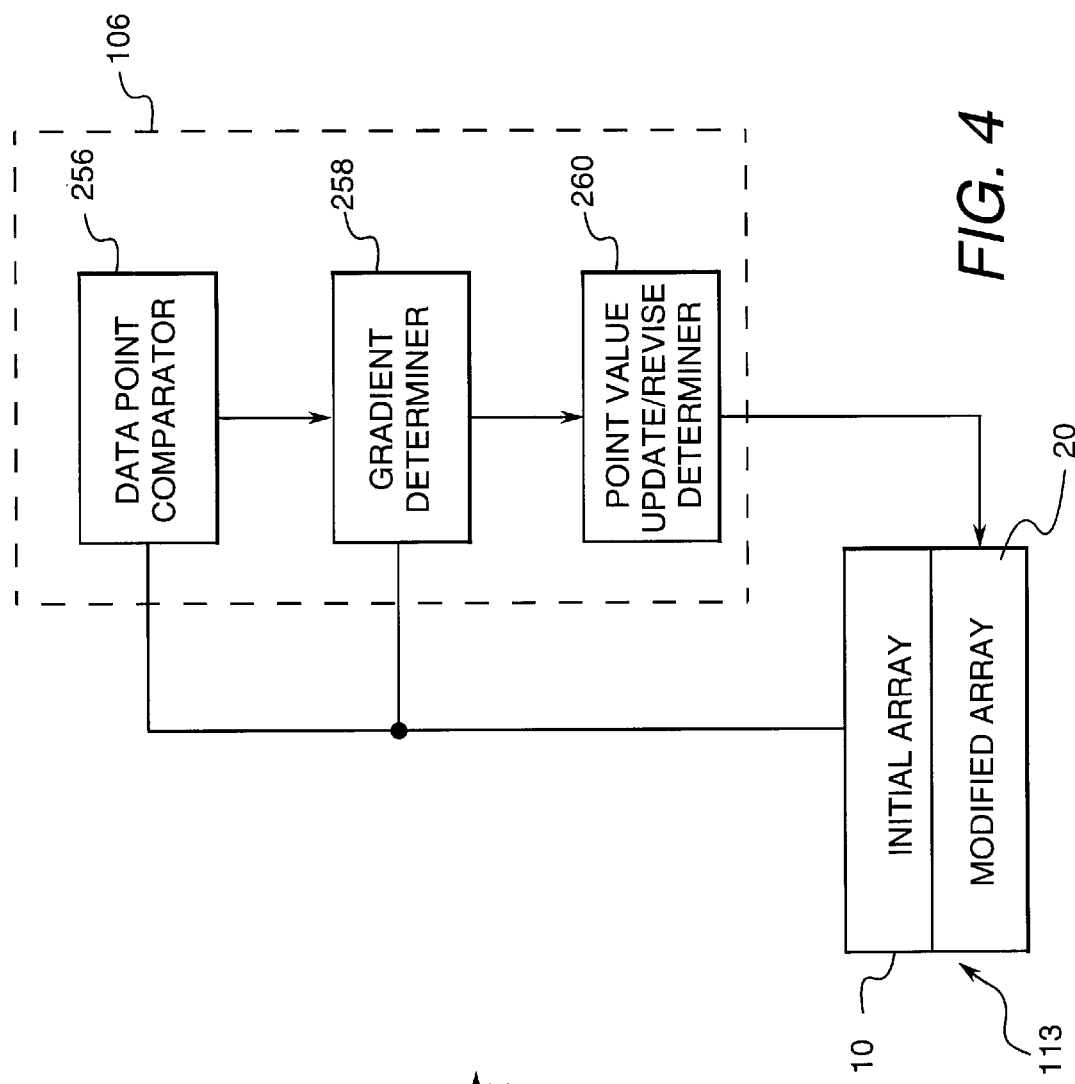
FIG. 4 is a schematic diagram of an image processor of FIG. 1.

Memory 113 of FIG. 1 includes, as shown in FIG. 4, two buffers 10 and 20. An initial TDDP array is stored in buffer 10 and a modified TDDP array according to the present invention is stored in buffer 20. The modified arrays are described in more detail below.

In one embodiment of the invention, image processor 106 of FIG. 1 includes a data point comparator 256, a gradient determiner 258 and a point value update/revise determiner 260, as shown in FIG. 4.

Comparator 256 is linked to memory 113 for accessing data stored in buffer 10. Comparator 256 is equipped to compare three separate data point values to determine the relationship of one of the three values to the other two. Specifically, given a specific TDDP array, then for each data point set in the array wherein each data point is a point of interest, comparator 256 receives the first, second and third data point values in the set.

For each data point set, comparator 256 compares the value of point P to the values of the other points in the set to determine if the point P value is greater than, less than, or between both of the other values in the set and, if between the values in the set, to determine which of the other values is greater than the point P value. For example, with respect to the first point set (i.e. N-P-S), comparator 256 determines the relationship between point P and the first point value p1 (i.e. point N value) and the second point value p2 (i.e. point S value).

Comparator 256 provides a relationship signal to the gradient determiner for each point set indicating the relationship between the points in the set. Thus, for each point of interest P (i.e. point in TDDP array), comparator 256 provides three relationship signals to determiner 258. For example, referring to FIG. 3, three relationship signals corresponding to point P may include a first signal indicating that the point P value is greater than the values of points N and S, a second signal indicating that the point P value is less than the point W value and greater than the point E value and a third signal indicating that the point P value is less than each of the values corresponding to points F and R.

Determiner 258 determines a gradient for each relationship signal received. The equations used to determine the gradients include two equation sets, one set used during an erosion process and the other set used during a dilation process. The erosion equation set includes the following rules for generating an erosion gradient Gn where n is NS, EW or FR corresponding to the axes in FIG. 3 and hence to the first, second and third sets (i.e. N-P-S; W-P-E and F-P-R), respectively, p1 is the first point (i.e. N, E or F) in each point set and p2 (i.e. S, W or R) is the last point in each point set:

P>p1 and p2, then:

$$G_n=\sqrt{(p1-P)^2+(p2-P)^2} \qquad (2)$$

P<p1 and p2, then:

$$G_n=0 \qquad (3)$$

p1<P<p2, then:

$$G_n=|P-p1| \qquad (4)$$

p2<P<p1, then:

$$G_n=|P-p2| \qquad (5)$$

The dilation equation set includes the following rules for generating a dilation gradient $G_n$ using the same nomenclature as indicated above:

P>p1 and p2, then:

$$G_n=0 \qquad (6)$$

P<p1 and p2, then:

$$G_n=\sqrt{(p2=P)^2+(p1-P)^2} \qquad (7)$$

p2<P<p1

$$G_n=|P-p1| \qquad (8)$$

p1<P<p2

$$G_n=|P-p2| \qquad (9)$$

After generating the three gradients $G_{NS}$, $G_{EW}$ and $G_{FR}$, one for each relationship signal, determiner 258 combines the gradients $G_{NS}$, $G_{EW}$ and $G_{FR}$ by solving the following equation:

$$G=\sqrt{G_{NS}^2+G_{EW}^2+G_{FR}^2} \qquad (10)$$

Combined gradient G is provided to determiner 260.

Determiner 260 receives third gradient G for a point of interest and modifies the point of interest value as a function of the gradient. Thus, determiner 260 generates a modified point of interest value P' by subtracting or adding a selected fraction of gradient G from the initial point of interest value, depending on whether the present process is an erosion process or a dilation process. In an exemplary embodiment of the invention the selected fraction of gradient G is one third. Thus, to determine modified point of interest values P', determiner 260 solves the following equation for erosion:

$$P'=P-G/3 \qquad (11)$$

and for dilation:

$$P'=P-G/3 \qquad (12)$$

The resulting point of interest value P' is either an eroded value or a dilated value, depending on the rule set (i.e. Equations 2 through 5 or Equations 6 through 9) applied by determiner 258.

According to an exemplary embodiment of the invention, beginning with an initial TDDP array stored in buffer 10, the erosion equation set (i.e. Equations 2 through 5) is applied to the TDDP array once and the resulting eroded TDDP array is stored in buffer 20. After a complete eroded array is stored in buffer 20, the eroded array is moved to buffer 10 and is effectively written over the initial TDDP array. The erosion process is then repeated N times (where N is an integer), to further erode the TDDP array data point values. At the end of the final erosion process the final TDDP array in buffer 20 is moved buffer 10. The final erosion array is referred to herein as an "updated" array and includes updated point values.

After the updated array has been generated and stored, the dilation equation set (i.e. Equations 6 through 9) is applied to the updated TDDP array once and the resulting dilated TDDP array is stored in buffer 20. After a dilated array is completely formed in buffer 20, the dilated array is moved into buffer 10 The dilation equation set is then applied N times, each time to the array in buffer 10, providing a new dilated array in buffer 20 which is then moved to buffer 10 prior to the next application of the dilation set. After the dilation set has been applied N times, the final dilated array is a revised array and includes revised array point values. An example of how this inventive system operates is instructive.

B. Exemplary Operation

Figure 3:
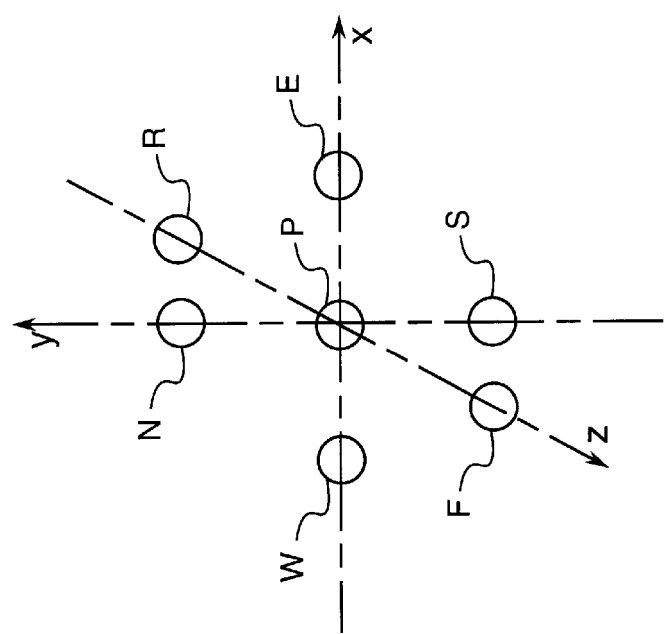
FIG. 3 is a schematic illustrating a TDDP array point of interest and surrounding data points used to determine first, second and third gradients according to the invention.

Referring to FIG. 3, an exemplary inventive process will be described in the context of point of interest P and surrounding point pairs N and S, E and W and F and R which are part of an initial TDDP array. Each point P, N, S, E, W, F and R has a characteristic intensity value. For the purposes of this explanation it will be assumed that the characteristic values are: P=10, N=8, S=8, E=12, W=13, F=12 and R=7.

Figure 5:
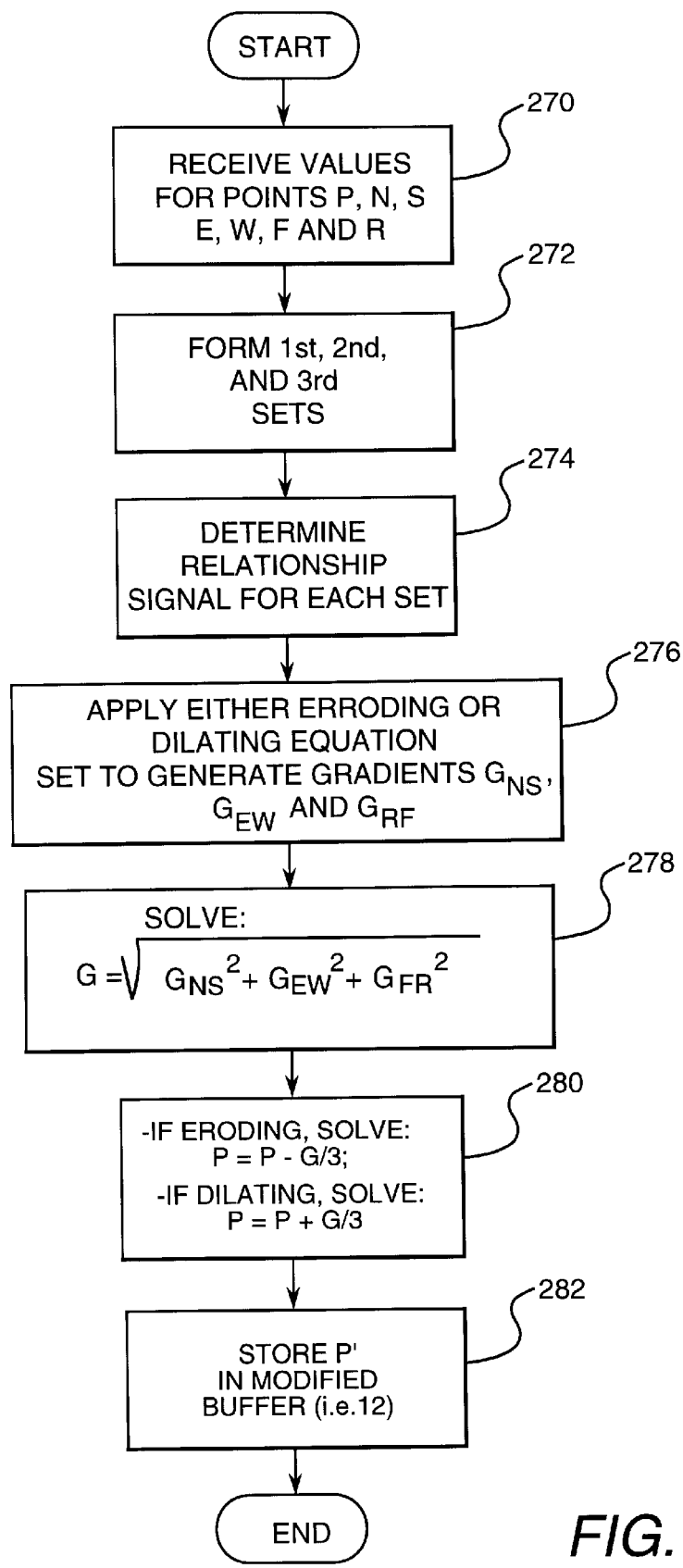
FIG. 5 is a flow chart illustrating a method of operation according to the invention.

An exemplary inventive method of operation is illustrated in FIG. 5. Referring to FIGS. 3, 4 and 5, at process step 270, comparator 256 receives point values for each point P, N, S, E, W, F and R. At step 272, comparator 256 groups the point values into three point value sets including a first set N, P, S, a second set E, P, W and a third set F, P, R. In each set, the values corresponding to points N, E and F are considered first point values p1 and the values corresponding to points S, W and R values are considered second point values p2.

At step 274, comparator 256 compares intra-set point values to determine the relationship between the point of interest P value and values p1 and p2. In the present example, for the first point set (i.e. N, P, S) where p1 is 8 (i.e. N is 8) and p2 is 8 (i.e. S is 8), comparator 256 determines that the point P value (i.e. 10) is greater than values p1 and p2 and generates a first relationship signal indicating so.

For the second point set (i.e. E, P, W), where p1 is 12 (i.e. E is 12) and p2 is 13 (i.e. W is 13), comparator 256 generates a second relationship signal indicating that the point P value is less than values p1 and p2. Similarly, for the third point set (i.e. F, P, R) where p1 is 12 (i.e. F is 12) and p2 is 7 (i.e. R is 7), comparator 256 generates a third relationship signal indicating that the point P value is less than value p1 and greater than value p2. Thus, comparator 256 provides three relationship values to determiner 258, one for each point set.

At step 276, determiner 258 receives the first, second and third relationship rules and also receives the point values corresponding to points P, N, S, E, W, F and R and applies the erosion rule set (i.e. Equations 2 through 5) once for each relationship signal to generate first, second and third erosion gradients $G_{NS}$, $G_{EW}$ and $G_{FR}$, respectively.

With respect to the first relationship signal, because the point P value is greater than p1 and p2, Equation 2 is applied to yield a first erosion gradient $G_{NS}$ of $\sqrt{8}$ (i.e. by inserting p1=8, p2=8 and p=10 into Equation 2). Similarly, for the second relationship signal, because the P value is less than p1 and p2, Equation 3 is applied and gradient $G_{EW}$ is 0. For the third relationship signal, because the P value is less than p1 and greater than p2 Equation 5 is applied and the third erosion gradient $G_{FR}$ is 3 (i.e. by inserting p2=7, P=10 into Equation 5).

At step 278, determiner 258 solves Equation 10 to generate combined gradient G. In the present example gradient G is 4.1231 (i.e. $\sqrt{8+0^{2}+3^{2}}=4.1231$). Gradient G is provided to determiner 260.

Next, at step 280, determiner 260 solves Equation 11 to determine a modified value for point P1. In the present example, the value for point P1 is 8.6256 (i.e. P-G/3=10-4.1231/3=8.6256). The P1 point value is stored in buffer 20 in a location corresponding to the position of point P in the initial TDDP array.

The above process is repeated for each point in the initial TDDP array using point values from the initial TDDP array, thereby generating a modified value in buffer 20 for each point in the initial TDDP array of buffer 20 After a complete modified/eroded TDDP array is amassed in buffer 20, the array is moved into buffer 10.

While many more subsequent erosion processes may be performed on the array in buffer 10, to simplify this explanation it is assumed that only one more erosion process is performed and that thereafter the values of points P, N, S, E, W, F and R are 7, 6, 5, 11, 10, 9 and 5.

Next, because two erosion processes were performed on the initial TDDP array, two dilation processes are performed on the updated TDDP array in buffer 10. Thus, with reference to FIGS. 4 and 5, comparator 256 receives values of points P, N, S, E, W, F and R at step 270 and generates three relationship values (steps 272 and 274) corresponding to the three point sets (i.e. N-P-S; E-P-W and F-P-R). Determiner 258 applies the dilation equations (i.e. Equations 6–9) to generate first, second and third dilation gradients $G_{NS}$, $G_{EW}$ and $G_{FR}$ (step 276) and then solves Equation 10 to generate a combined gradient G (step 278) which is provided to determiner 260. At step 280, determiner 260 solves Equation 12, generating a modified point of interest value P' which is stored in buffer 20 at block 282.

After a complete dilated array has been stored in buffer 20, the dilated array is moved to buffer 10 and dilation is repeated. After completion of the second dilation process the array in buffer 20 is a filtered, final and revised array which can be used for image processing.

The invention contemplates modifications to the exemplary embodiments provided above. For example, the specific fraction (i.e. ⅓) of the combined gradient in Equations 11 and 12 may be altered (e.g. may be ¼ or ⅕). In addition, slight variations in the equation sets are also contemplated.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A method for reducing noise in a three dimensional rectilinear parallelepiped data point array, the three dimensions being first, second and third dimensions and each data point being associated with a point value, the method comprising, for each array data point wherein the data point is a point of interest, the steps of:
   determining first, second and third erosion gradients through the point of interest along the first, second and third dimensions, respectively; and
   modifying the point of interest value as a function of the erosion gradients, thereby generating an updated point of interest value.

2. The method of claim 1 wherein the first, second and third dimensions are aligned along north-south, east-west and fore-rear axes, respectively, and the first gradient is determined by considering values of the point of interest and north and south data points directly to the north and south of the point of interest, respectively, the second gradient is determined by considering values of the point of interest and of east and west data points directly to the east and west of the point of interest, respectively, and the third gradient is determined by considering values of the point of interest and of forward and rearward data points directly to the fore and rear of the point of interest, respectively.

3. The method of claim 2 wherein the north and south points, east and west points and fore and rear points corresponding to the point of interest are first, second and third point pairs, each of the north, east and fore points are first points and each of the south, west and rear points are second points in associated point pairs and each step of considering values includes the steps of:
- comparing the values of the point of interest and the first and second points;
- mathematically combining the first and second point and point of interest values to generate the gradient when the point of interest value is greater than each of the first and second point values or is between the first and second point values; and
- setting the gradient equal to zero when the point of interest value is less than each of the first and second point values.

4. The method of claim 3 wherein the step of mathematically combining includes the steps of, mathematically combining the first and second point and point of interest values to generate the gradient when the point of interest value is greater than each of the first and second point values, mathematically combining the values of the first point and point of interest when the point of interest value is greater than the first point value and less than the second point value, and mathematically combining the values of the second point and point of interest when the point of interest value is greater than the second point value and less than the first point value.

5. The method of claim 4 wherein the step of mathematically combining the first and second point and point of interest values includes subtracting the first point value from the point of interest value to generate a first difference, subtracting the second point value from the point of interest value to generate a second difference, and taking the square root of the sum of the squares of the first and second differences.

6. The method of claim 5 wherein the step of mathematically combining the first point and point of interest values includes the step of setting the gradient equal to the magnitude of the difference between the first point and point of interest values and the step of mathematically combining the second point and point of interest values includes the step of setting the gradient equal to the magnitude of the difference between the second point and point of interest values.

7. The method of claim 1 including, after the step of determining, mathematically combining the first, second and third gradients into a combined gradient, and wherein the step of modifying the point of interest value as a function of the erosion gradient includes modifying the point of interest value as a function of the combined gradient.

8. The method of claim 7 wherein the step of mathematically combining the gradients includes taking the square root of the sum of the squares of the first, second and third gradients to provide the combined gradient.

9. The method of claim 8 wherein the step of modifying the point of interest value as a function of the combined gradient includes the step of mathematically combining the point of interest value and the combined gradient to generate the updated point of interest value.

10. The method of claim 9 wherein the step of mathematically combining the point of interest value and the gradient includes the step of subtracting a selected fraction of the combined gradient from the point of interest value.

11. The method of claim 10 wherein the selected fraction is between one fifth and one half.

12. The method of claim 10 wherein the method is repeated.

13. The method of claim 1 further including, for each updated point of interest value after an updated value is identified for each point of interest, the steps of:
- determining first, second and third dilation gradients through the updated point of interest along the first, second and third dimensions, respectively; and
- modifying the updated point of interest value as a function of the dilation gradients, thereby generating a revised point of interest value.

14. The method of claim 13 wherein the first, second and third dimensions are aligned along north-south, east-west and fore-rear axes, respectively and the first dilation gradient is determined by considering values of the updated point of interest and north and south data points directly to the north and south of the updated point of interest, respectively, the second dilation gradient is determined by considering values of the updated point of interest and of east and west data points directly to the east and west of the updated point of interest, respectively, and the third dilation gradient is determined by considering values of the updated point of interest and of forward and rearward data points directly to the fore and rear of the updated point of interest, respectively.

15. The method of claim 14 wherein the north and south points, east and west points and fore and rear points corresponding to the updated point of interest are first, second and third point pairs, each of the north, east and fore points are first points and each of the south, west and rear points are second points in associated point pairs and each step of considering values includes the steps of:
- comparing the values of the updated point of interest and the first and second points;
- mathematically combining the first and second point and updated point of interest values to generate the dilation gradient when the updated point of interest value is less than each of the first and second point values or is between the first and second point values; and
- setting the dilation gradient equal to zero when the updated point of interest value is greater than each of the first and second point values.

16. The method of claim 15 wherein the step of mathematically combining includes the steps of, mathematically combining the first and second point and updated point of interest values to generate the dilation gradient when the updated point of interest value is less than each of the first and second point values, mathematically combining the values of the second point and updated point of interest when the updated point of interest value is greater than the first point value and less than the second point value, and mathematically combining the values of the second point and updated point of interest when the updated point of interest value is greater than the second point value and less than the first point value.

17. The method of claim 16 wherein the step of mathematically combining the first and second point and updated point of interest values includes subtracting the first point value from the updated point of interest value to generate a first difference, subtracting the second point value from the updated point of interest value to generate a second difference, squaring the first and second differences, adding the first and second squared differences to generate a sum and taking the square root of the sum.

18. The method of claim 17 wherein the step of mathematically combining the first point and updated point of interest values includes the step of setting the dilation gradient equal to the magnitude of the difference between the first point and updated point of interest values and the step of mathematically combining the second point and updated point of interest values includes the step of setting the dilation gradient equal to the magnitude of the difference between the second point and updated point of interest values.

19. The method of claim 13 including, after the step of determining dilation gradients, mathematically combining the first, second and third dilation gradients into a combined gradient, and wherein the step of modifying the updated point of interest value as a function of the dilation gradients includes the step of modifying the point of interest value as a function of the combined gradient.

20. The method of claim 19 wherein the step of mathematically combining the gradients includes taking the square root of the sum of the squares of the first, second and third gradients to provide the combined gradient.

21. The method of claim 20 wherein the step of modifying the point of interest value as a function of the combined gradient includes the step of mathematically combining the point of interest value and the combined gradient to generate the updated point of interest value.

22. The method of claim 21 wherein the step of mathematically combining the point of interest value and the gradient includes the step of adding a selected fraction of the combined gradient to the point of interest value.

23. Apparatus for reducing noise in a three dimensional rectilinear parallelepiped data point array, the three dimensions being first, second and third dimensions and each data point being associated with a point value, the apparatus comprising:

a programmed data processor for running a program which, for each array data point wherein the data point is a point of interest:

determines first, second and third erosion gradients through the point of interest along the first, second and third dimensions, respectively; and modifies the point of interest value as a function of the erosion gradients, thereby generating an updated point of interest value.

24. The apparatus of claim 23 wherein the first, second and third dimensions are aligned along north-south, east-west and fore-rear axes, respectively and the first gradient is determined by considering values of the point of interest and north and south data points directly to the north and south of the point of interest, respectively, the second gradient is determined by considering values of the point of interest and of east and west data points directly to the east and west of the point of interest, respectively, and the third gradient is determined by considering values of the point of interest and of forward and rearward data points directly to the fore and rear of the point of interest, respectively.

25. The apparatus of claim 24 wherein the north and south points, east and west points and fore and rear points corresponding to the point of interest are first, second and third point pairs, each of the north, east and fore points are first points and each of the south, west and rear points are second points in associated point pairs and wherein the processor, as programmed for each step of considering values, is adapted to compare the values of the point of interest and the first and second points and, when the point of interest value is greater than each of the first and second point values or is between the first and second point values, mathematically combine the first and second point and point of interest values to generate the gradient and, when the point of interest value is less than each of the first and second point values, set the gradient equal to zero.

26. The apparatus of claim 23 wherein, after determining said first, second and third erosion gradients, the processor is programmed to mathematically combine the first, second and third gradients into a combined gradient and to modify the point of interest value as a function of the erosion gradients by modifying the point of interest value as a function of the combined gradient.

27. The apparatus of claim 26 wherein the processor is programmed to mathematically combine the gradients by taking the square root of the sum of the squares of the first, second and third gradients to provide the combined gradient.

28. The apparatus of claim 27 wherein the processor is programmed to modify the point of interest value as a function of the combined gradient by mathematically combining the point of interest value and the combined gradient to generate the updated point of interest value.

29. The apparatus of claim 28 wherein the processor is programmed to mathematically combine the point of interest value and the gradient by subtracting a selected fraction of the combined gradient from the point of interest value.

30. The apparatus of claim 29 wherein the selected fraction is between one fifth and one half.

31. The apparatus of claim 23 wherein, for each updated point of interest value, the processor is also programmed to determine, after an updated value is identified for each point of interest, first, second and third dilation gradients through the updated point of interest along the first, second and third dimensions, respectively, and to modify the updated point of interest value as a function of the dilation gradients, thereby generating a revised point of interest value.

32. The apparatus of claim 31 wherein the first, second and third dimensions are aligned along north-south, east-west and fore-rear axes, respectively, and the processor is further programmed to determine the first dilation gradient by considering values of the updated point of interest and north and south data points directly to the north and south of the updated point of interest, respectively, to determine the second dilation gradient by considering values of the updated point of interest and of east and west data points directly to the east and west of the updated point of interest, respectively, and to determine the third dilation gradient by considering values of the updated point of interest and of forward and rearward data points directly to the fore and rear of the updated point of interest, respectively.

33. The apparatus of claim 32 wherein the north and south points, east and west points and fore and rear points corresponding to the updated point of interest are first, second and third point pairs, each of the north, east and fore points are first points and each of the south, west and rear points are second points in associated point pairs and wherein the processor, as programmed for each step of considering values, is adapted to compare the values of the updated point of interest and the first and second points when the updated point of interest value is less than each of the first and second point values or is between the first and second point values, mathematically combine the first and second point and updated point of interest values to generate the dilation gradient and, when the updated point of interest value is greater than each of the first and second point values, set the dilation gradient equal to zero.

34. The apparatus of claim 31 wherein, after determining said first, second and third dilation gradients, the processor is programmed to mathematically combine the first, second and third dilation gradients into a combined gradient and to modify the updated point of interest value as a function of the dilation gradients by modifying the updated point of interest value as a function of the combined gradient.

35. The apparatus of claim 34 wherein the processor is programmed to mathematically combine the gradients by taking the square root of the sum of the squares of the first, second and third gradients to provide the combined gradient.

36. The apparatus of claim 35 wherein the processor is programmed to modify the point of interest value as a function of the combined gradient by mathematically combining the point of interest value and the combined gradient to generate the updated point of interest value.

37. The apparatus of claim 36 wherein the processor is programmed to mathematically combine the point of interest value and the gradient by adding a selected fraction of the combined gradient to the point of interest value.

38. The apparatus of claim 23 wherein the processor includes a comparator for determining a relationship of one of three separate data point values to the other two of the three separate data point values, a gradient determiner for receiving relationship signals from said comparator and determining a combined gradient value for the signals received from said comparator, and a point value update/revise determiner for receiving the combined gradient value and generating the updated point of interest value.

* * * * *